United States Patent [19]

Honda et al.

[11] 4,036,549
[45] July 19, 1977

[54] WIRE CONNECTOR

[75] Inventors: Takeo Honda; Hisatomo Matsushima, both of Yokohama, Japan

[73] Assignee: Victor Company of Japan, Limited, Japan

[21] Appl. No.: 674,833

[22] Filed: Apr. 7, 1976

Related U.S. Application Data

[63] Continuation of Ser. No. 500,551, Aug. 26, 1974, abandoned.

[30] Foreign Application Priority Data

Aug. 27, 1973 Japan .................................. 48-96015
Nov. 20, 1973 Japan ........................... 48-133936[U]
Nov. 30, 1973 Japan ........................... 48-138435[U]

[51] Int. Cl.² .............................................. H01R 9/06
[52] U.S. Cl. ................................................ 339/275 R
[58] Field of Search ............................... 339/220, 275

[56] References Cited

U.S. PATENT DOCUMENTS

| | | | |
|---|---|---|---|
| 2,438,075 | 3/1948 | Smith | 339/275 B |
| 2,846,659 | 8/1958 | Hinspater et al. | 339/275 B |
| 3,093,887 | 6/1963 | Prestige et al. | 339/220 R |
| 3,156,517 | 11/1964 | Maximoff et al. | 339/275 B |
| 3,510,831 | 5/1970 | De Vito | 339/275 B |
| 3,686,625 | 8/1972 | Krehbul, Sr. et al. | 339/275 B |

FOREIGN PATENT DOCUMENTS 728,795  2/1966  Canada .............................. 339/176 M Primary Examiner—Joseph H. McGlynn
Attorney, Agent, or Firm—Robert E. Burns; Emmanuel J. Lobato; Bruce L. Adams

[57] ABSTRACT

A socket has projections inside surface which cause slight deformation and thus good grip of a lead wire inserted into the socket.

3 Claims, 14 Drawing Figures

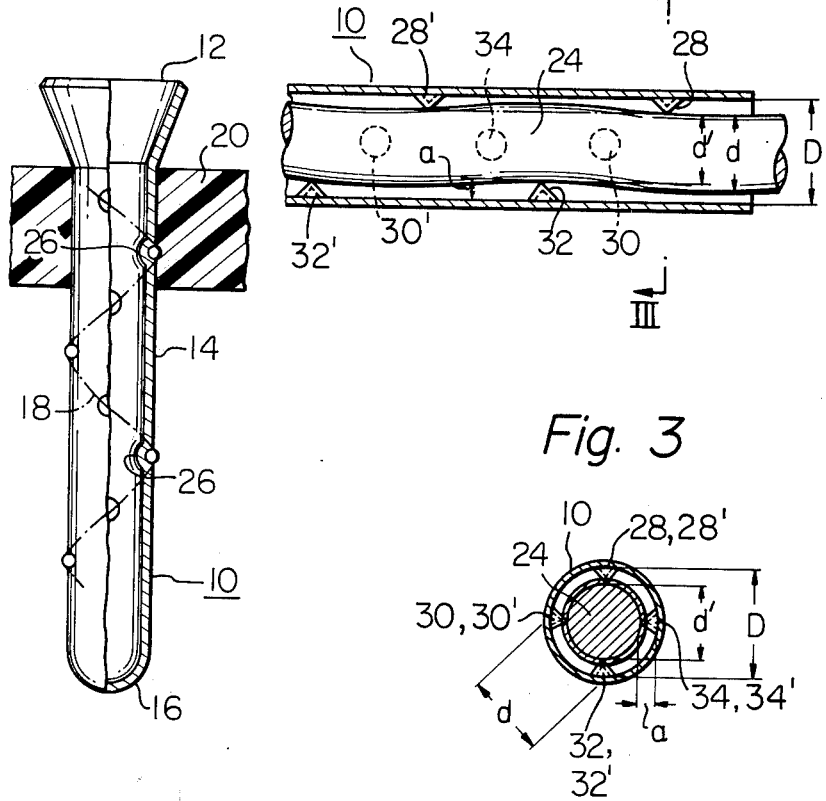

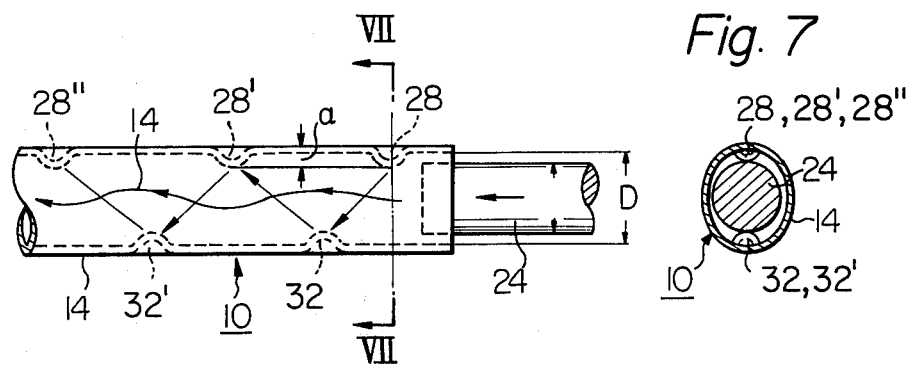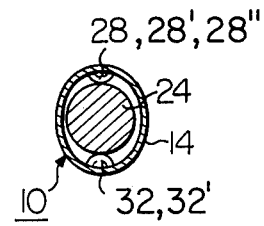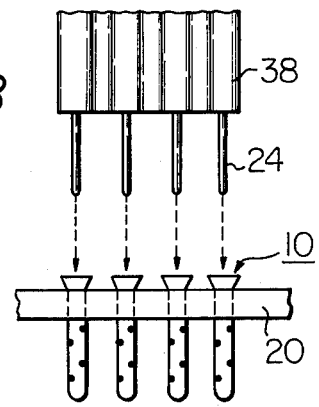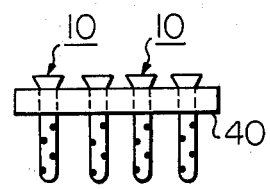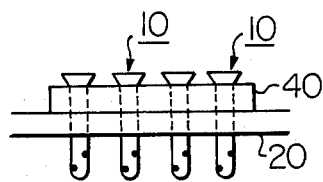

WIRE CONNECTOR

This is a continuation, of application Ser. No. 500,511, Filed Aug. 26, 1974, now abandoned.

This invention relates generally to wire connecting devices and particularly to a wire connecting device in the from of a hollow elongate body for making joints in wires, and more particularly to a wire connecting device primarily used for providing joints of wires in a printed circuit.

Prior art wire connecting devices or connectors used in printed circuits comprise a mating plug and receptacle in which the plug is inserted. To insure good electrical contact, the receptacle usually comprises a pair of leaf springs or the like in opposed relationship to each other. The mating plug is usually of a hard material having sufficient strength to overcome the spring action so that when the plug is being inserted into the receptacle, the plug pushes the leaf springs away from each other. Since the mating plug should be of a hard material, connection must be made to wires of associated circuits and the additional contact points give rise to another potential source of contact failures. Furthermore, in designing the leaf springs, due consideration should be given to the elasticity, conductivity and durability of the material used.

An object of the present invention is to provide an improved wire connecting device in the form of a a hollow, elongate body in which a wire is directly inserted.

Another object of the invention is the provision of punched-in projections on the inner wall surface of the hollow body, so that when the wire is inserted thereinto the projections provide a high holding power for joining the wire and the hollow body together.

A further object of the invention is to provide a wire connecting device which is simple in construction and economical.

Other objects and features of the invention may be had by referring to the following description and claims, taken in conjunction with the accompanying drawings, in which:

FIG. 1 is a view in elevation of a wire connector according to the invention, partly broken away along the longitudinal axis thereof;

FIG. 2 is a longitudinal section view of a part of the FIG. 1 connector;

FIG. 3 is a cross section view taken along the line III—III of the FIG. 2 connector;

FIG. 4 is a cross section view of another connector profile;

FIG. 5 is a cross section view of still another connector profile;

FIG. 6 is a side elevation view in part of another embodiment of a connector of the invention;

FIG. 7 is a cross section view taken along the line VII—VII of the FIG. 6 connector;

FIG. 8 shows several connectors of the invention positioned to receive the lead wires of a ribbon cable;

FIGS. 9a and 9b show several connectors inserted through a base and thus providing a connector assembly on a printed circuit board;

In all figures, like reference numerals will be used to designate like or equivalent portions or parts.

Figure 10:
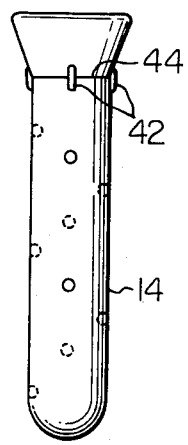
FIG. 10 shows a modified connector of the invention.

In FIG. 1, there is depicted a preferred embodiment of the invention, in which a wire connector, generally indicated by the reference numeral 10, is comprised of a funnel shaped top end 12, a body or sleeve portion 14, and a bottom portion 16. The connector 10 is conductive and is made of brass, or the like. The top end 12 is open. The body 14 is cylindrical, and the bottom portion 16 is closed. As seen in FIG. 1, a number of projections 26 are formed on the inner surface of the body portion 14 along a helical path shown by the dash-and-dot line 18 the axis of which coincides with the axis of the connector 10. These projections may be formed by punching or the like.

The thus constructed connector 10 is inserted into a hole of a printed circuit board 20, as shown. Then, the connector 10 is affixed by soldering to the printed circuit board 20, as shown in FIG. 1. A cable 22 is just stripped and its lead wire 24 or an elongated conductor may directly be inserted into the connector 10 without a plug. (FIG. 2)

The diameter d of the lead wire 24 of the cable 22 is not only related to the inside diameter D of the connector 10 with the relationship of $D > d$, but is also related to the diameter d' of an imaginary circle of the peaks of projections 26 with the relationship $d' < D$. Moreover, the diameters of the lead wire, the inside diameter of the connector, and the height a' of the projections 26 are related by $D - 2a < d < D - a$.

When the lead wire 24 is being inserted into the connector 10, the lead wire 24 progresses through the connector 10 and as seen in FIG. 2 is at first bent downward at the first shown projection 28, and with further progression it is bent toward the reverse side of the paper of the drawing at projection 30. With further subsequent into the connector it will experience the changes of direction at subsequent projections shown, as at 32, 34, 30, 32', and so on. Thus, upon completion of the insertion the lead wire 24 is bent in accordance with the disposition of the projections, i.e. along the helical path previously described. In this case, the thus bent lead wire 24 maintains its capability of being removed and, the electrical connection between the lead wire 24 and the connector 10 as well as a sure engagement between the elements 10 and 24 are assured. It is to be noted that such electrical and mechanical functions are attained with a simple construction, i.e. without the insulating body occupying a large space, and without a plug attached to the lead wire end. Furthermore, in this embodiment, fixing of the connector 10 to the printed circuit board may be made just by soldering, as in the case of conventional electrical components, without wiring work.

The funnel top end portion 12 of the connector 10 brings about useful effects due to its configuration. When the connector 10 is inserted into the hole of the printed circuit board 20, the funnel top end portion engages with the surface of the printed circuit board 20, thereby fixedly holding the connector 10. Additionally, since the taper of the funnel guides the wire 24 into the body portion 14, the insertion of the wire 24 is facilitated. Moreover, the funnel shape of the top end 12 serves to prevent soldering flux from entering into the connector 10, when soldering.

The bottom 16 of the connector 10 is closed so that, even when the lower side of the printed circuit board 20 with the connector 10 is dipped in melted solder, no melted solder flows into the connector 10.

It is to be noted that the connector 10 is not limited to a cylindrical configuration, but it may take any other shape, if the relationship previously described holds among the inner diameter of the contact member, the diameter of the imaginary circle defined by the ends of the projections 26 and the diameter of the wire 24. In FIGS. 4 and 5, a triangle and square shaped connector profiles are shown, respectively.

Although in the previous example, the projections 26 are arranged on the inner wall surface of the body portion 14 of the connector 10 in a helical pattern as previously described, they may be arranged as at 28, 28', 28" and 32, 32', the projections 28, 28', 28" being staggered relative to the projections 32 and 32' in a zigzag form, as shown in FIGS. 6 and 7. In this case the lead wire 24 is bent at the projections 28 in a zigzag fashion when inserted into connector 10. As in the case of a helical projection arrangement, the bent wire 24 maintains a close mechanical and electrical contact with connector 10 at the projections 28.

When several connectors 10 are required the desired member of holes are first drilled through the printed circuit board with the interval coincident with that of the lead wires 24 of a ribbon cable 38. Then, the connectors 10 are inserted into the holes, and fixed to the printed circuit board. Finally, the lead wires 24 are all simultaneously inserted into the connectors 10, as shown in FIG. 8.

When fitting a plurality of lead wires 24 into the printed circuit board 20, it is preferable to first fix all connectors to a base member 40, as shown in FIG. 9a. Then, the base member 40 with the connectors 10 is fitted onto the print circuit board 20, as shown in FIG 9b. Just a tight fit or a proper adhesive may be used to fix the connectors 10 to the base 40.

The inside diameter of the connector 10 is determined by the diameter of the lead wire 24 and is therefore very small. Thus, it s very difficult to plate the inside wall surface of the connector 10 so that it is apt to oxidize. For this, before insertion of the wire 24, contact protection grease such as silicone grease, contact grease, etc is applied on the inside wall surface of the connector 10 with a grease injector (not shown).

The concept of the present invention is applicable to any other kind of connectors than those described above.

Figure 11:
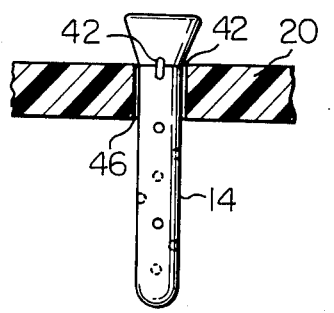
FIG. 11 shows the FIG. 10 connector inserted through a printed circuit board.

A connector 10 embodying a modification of the present invention is illustrated in FIG. 10, in which the connector 10 is provided with projections 42 protruding radially outwardly around the neck 44 of the funnel end 12. The projections are used for provisionally holding the connector 10 to the printed circuit board 20 in the course of the fixing operation thereof. The projections are so dimensioned that the diameter of the circle of the projections 42 is larger than that of a hole 46 in the board 20. The connector 10 with projections around the neck portion 44 of the connector 10, as shown in FIG. 11, is press fitted into the hole 46. Thus, the lack stability of the inserted connector due to loose insertion thereof is eliminated with the result that soldering may be done smoothly.

Figure 12:
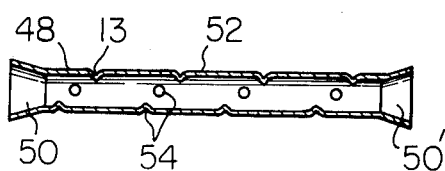
FIG. 12 shows a connector capable of receiving two wires through its opposite ends.
Figure 13:
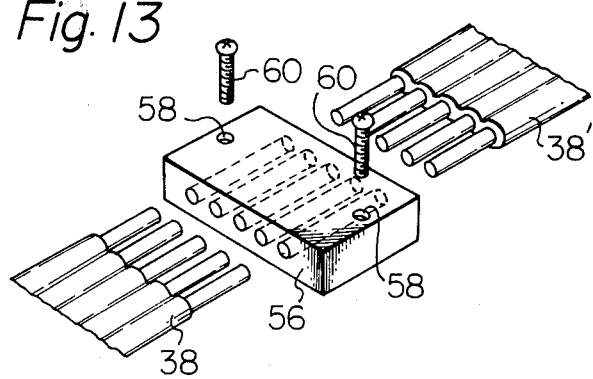
FIG. 13 shows a plurality of FIG. 12 connectors parallelly imbedded in a holder to receive lead wires of two ribbon cables.

Referring now to FIGS. 12 and 13, there is shown a relaying connector embodying the present invention. The relaying connector 48 is a conductive tube of brass, for example, and has funnel like opening ends 50 and 50', and provided on the inner wall surface of the tube like body portion 52 is a plurality of projections 54. The projections 54 are preferably disposed in a helical pattern, as previously described with reference to the connector shown in FIG. 1. The projections 54 are also formed by punching, as in the previous cases.

Besides the use of single relaying connectors described, these connectors may be utilized in a multiple mode as shown in FIG. 13. In the arrangement of FIG. 13, several relaying connectors 48 are embedded parallelly in a row in a single insulating molded holder 56 which has holes 58 to receive respective screws 60 for fixing the holder 56 on a support (not shown).

What is claimed is:

1. An electrical connector comprising: a hollow elongated conductive sleeve portion having a conductor-receiving bore having a generally cross section for receiving, in use, an elongated conductor insertable therein; said sleeve portion having at least one row of spaced rigid projections projecting inwardly of said bore and disposed axially and perimetrically of said bore along a generally helical path; and said projections having an inward extent $a$ into said bore satisfying the relationship $D - 2a < d < D - a$ wherein $D$ is a transverse dimension of the bore and $d$ is a transverse dimension of the elongated conductor so that the elongated conductor contacts the projections when inserted into the bore and assumes a generally helical shape, thereby to impart resistance to removal of the elongated conductor from said bore.

2. The combination comprising: an electrically insulative body; and a plurality of electrical connectors embedded within said insulative body, and each electrical connector electrically insulated from respective ones of said plurality of electrical connectors by said electrically insulative body; wherein at least one of said electrical connectors comprises, a hollow elongated conductive sleeve portion having a conductor-receiving bore having a generally circular cross section for receiving, in use, an elongated conductor insertable therein; said portion having at least one row of spaced rigid internal projections inwardly of said bore and disposed axially and perimetrically of said bore along a generally helical path; and said projections having an inward extent $a$ into said bore satisfying the relationship $D - 2a < d < D - a$ wherein $D$ is a transverse dimension of the bore and $d$ is a transverse dimension of the elongated conductor so that the elongated conductor contacts the projections when inserted into the bore and assumes a generally helical shape, thereby to impart resistance to removal of the elongated conductor from said bore.

3. An electrical connector, securable in use in a circuit board having a hole for receiving the connector, comprising:
a hollow elongated conductive sleeve portion having a conductor-receiving bore for receiving, in use, an elongated conductor insertable therein, one end of said sleeve portion being open and the other end being closed and said bore having a generally circular cross section, said sleeve portion having at least one row of spaced rigid projections projecting inwardly of said bore and disposed axially and perimetrically of said bore along a generally helical path, and said projections having an inward extent $a$ into said bore satisfying the relationship $D - 2a < d < D - a$ wherein $D$ is a transverse dimension of said bore and $d$ is a transervse dimension of the elongated conductor so that the elongated conductor contacts the projections when inserted into the bore and assumes a generally helical shape, thereby to impart resistance to removal of the elongated conductor from said bore, said sleeve portion having an external transverse dimension substantially equal to a transverse dimension of a hole in a circuit board and insertable in use therein;

a hollow conical end portion coaxial with the conductor-receiving bore joined to the open end of said sleeve portion, outwardly diverging along a direction away from said sleeve portion, and having a transverse dimension greater than half of said sleeve portion; and a plurality of rigid projections along and adjacent to the junction of said sleeve portion and said conical end portion and projecting outwardly therefrom, said plurality of rigid projections being capable of penetrating the board to embed therein and engage the board when the electrical connector is inserted into the hole, thereby to secure the connector in the hole.

* * * * *

UNITED STATES PATENT AND TRADEMARK OFFICE
CERTIFICATE OF CORRECTION

PATENT NO. : 4,036,549
DATED : July 19, 1977
INVENTOR(S) : Takeo Honda; Hisatomo Matsushima It is certified that error appears in the above-identified patent and that said Letters Patent are hereby corrected as shown below:

Claim 1, line 3, after "generally" insert --circular--.

Signed and Sealed this

Sixteenth Day of May 1978

[SEAL]

Attest:

RUTH C. MASON
Attesting Officer

LUTRELLE F. PARKER
Acting Commissioner of Patents and Trademarks